US008466074B2

(12) United States Patent
Cho et al.

(10) Patent No.: US 8,466,074 B2
(45) Date of Patent: Jun. 18, 2013

(54) METHOD FOR PROCESSING A SUBSTRATE USING A LASER BEAM

(75) Inventors: Sung-il Cho, Asan-si (KR); Ho-tae Jin, Cheonan-si (KR); Heui-seog Kim, Asan-si (KR); Seon-ju Oh, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 108 days.

(21) Appl. No.: 13/083,043

(22) Filed: Apr. 8, 2011

(65) Prior Publication Data
US 2011/0256736 A1 Oct. 20, 2011

(30) Foreign Application Priority Data

Apr. 14, 2010 (KR) .................. 10-2010-0034391

(51) Int. Cl.
*H01L 21/268* (2006.01)
(52) U.S. Cl.
USPC .................. 438/795; 257/E21.347

(58) Field of Classification Search
USPC ........................... 438/795, E21.347
See application file for complete search history.

(56) References Cited

U.S. PATENT DOCUMENTS

| 5,922,224 | A | 7/1999 | Broekroelofs |
| 2007/0099439 | A1 | 5/2007 | Van Borkulo et al. |
| 2007/0148834 | A1* | 6/2007 | Tanaka et al. ............. 438/151 |
| 2008/0113493 | A1 | 5/2008 | Chall |
| 2012/0018732 | A1* | 1/2012 | Aida et al. ................. 257/75 |
| 2012/0064735 | A1* | 3/2012 | Zhang et al. ............... 438/795 |

FOREIGN PATENT DOCUMENTS

KR 10-2009-0014498 A 2/2009

* cited by examiner

*Primary Examiner* — Alexander Ghyka
*Assistant Examiner* — Stanetta Isaac
(74) *Attorney, Agent, or Firm* — Lee & Morse, P.C.

(57) ABSTRACT

A method for processing a substrate includes generating a first laser beam, splitting the first laser beam into a plurality of second laser beams, focusing the split second laser beams on a plane in the substrate parallel to a main surface of the substrate, and performing surface separation of the substrate along the plane.

22 Claims, 10 Drawing Sheets

METHOD FOR PROCESSING A SUBSTRATE USING A LASER BEAM

BACKGROUND

1. Field

Embodiments relate to a method for processing a substrate using a laser beam, and more particularly, to a method for processing a substrate to perform surface separation on a semiconductor substrate such as a wafer.

2. Description of the Related Art

Semiconductor devices are manufactured by a fabrication process for forming a pattern according to the characteristic of a semiconductor device on a wafer and an assembly process for separating the wafer on which the pattern is formed into a plurality of chips. A wafer polishing process for mechanically polishing an inactive surface of the wafer, where no pattern is formed, to reduce the thickness of the wafer may be performed between the fabrication process and the assembly process. In order to effectively perform the mechanical polishing, slurry is used and sludge is generated as wafer polishing residue.

SUMMARY

Embodiments are directed to a method for processing a substrate. The method may include generating a first laser beam, splitting the first laser beam into a plurality of second laser beams, focusing the split second laser beams on a plane in the substrate, the plane being parallel to a main surface of the substrate, and performing surface separation of the substrate along the plane.

The method may include translating the substrate, relative to the split second laser beams, in a direction parallel to the plane after focusing the split second laser beams on the plane in the substrate.

The method may include rotating the substrate, relative to the split second laser beams, in a direction parallel to the plane after focusing the split second laser beams on the plane in the substrate.

Splitting the first laser beam may include directing the first laser beam onto a diffractive optical element.

The diffractive optical element may include a plurality of diffraction gratings, the method further comprising positioning the plurality of diffraction gratings at an angle relative to the first laser beam.

The substrate may include an edge area surrounding the plane. The method may include removing the edge area of the substrate before performing the surface separation of the substrate along the plane.

Each of the split second laser beams may have a first energy distribution. Focusing the split second laser beams on the plane may include overlapping the split second laser beams to have a second energy distribution along the plane in the substrate, the second energy distribution being more uniform that the first energy distribution.

The first energy distribution may be a Gaussian energy distribution and focusing the split second laser beams on the plane in the substrate may include directing the split second laser beams onto a focus lens.

Focusing the split second laser beams on the plane in the substrate forms a plurality of reformed areas on the plane in the substrate. Performing surface separation of the substrate along the plane may include applying stress to the substrate to allow cracks to be propagated along the plane between reformed areas.

Applying stress to the substrate may include applying stress to a side surface of the substrate using water jet, aerosol jet, laser, or a blade, the side surface of the substrate being orthogonal to the main surface of the substrate.

Applying stress to the substrate may include applying shock waves to a side surface of the substrate using an ultraviolet (UV) laser, the side surface of the substrate being orthogonal to the main surface of the substrate.

Applying stress to the substrate may include applying thermal stress to the substrate by heating or cooling the substrate.

Applying stress to the substrate may include fixing each of an upper area and a lower area, where the plane is disposed therebetween, and moving at least one of the upper area and the lower area in a direction orthogonal to or parallel to the plane.

The method may include forming a plurality of reformed areas by moving the substrate, the reformed areas being within the substrate, and performing the surface separation of the substrate along the plane includes separating the substrate at the reformed areas.

The method may include, before performing surface separation, removing an edge area in a direction orthogonal to the plane, the edge area surrounding reformed areas on the plane in the substrate.

According to embodiments, a method for processing a substrate may include forming a reformed region on a plane in the substrate parallel to a main surface of the substrate, and separating the substrate along the plane of the substrate.

Forming the reformed region may include focusing light on the plane.

Focusing light may include providing light on the plane having a more uniform energy distribution than a Gaussian distribution.

Separating the substrate may include applying stress to a side surface of the substrate, the side surface of the substrate being orthogonal to the main surface of the substrate.

Separating the substrate may include fixing each of an upper area and a lower area, where the plane is disposed therebetween, and moving at least one of the upper area and the lower area in a direction orthogonal to or parallel to the plane.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0034391, filed on Apr. 14, 2010, in the Korean Intellectual Property Office, and entitled: "Method for Processing Substrate Using Laser Beam," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the following description, when a layer is described to exist on another layer, the layer may exist directly on the other layer or a third layer may be interposed therebetween. Also, the thickness or size of each layer illustrated in the drawings is exaggerated for convenience of explanation and clarity. Like references indicate like constituent elements in the drawings. As used in the present specification, the term "and/or" includes any one of listed items and all of at least one combination of the items.

The expression of singularity in the present specification includes the expression of plurality unless clearly specified otherwise in context. Also, terms such as "comprise" and/or "comprising" may be construed to denote a certain characteristic, number, step, operation, constituent element, or a combination thereof, but may not be construed to exclude the existence of, or a possibility of addition of, one or more other characteristics, numbers, steps, operations, constituent elements, or combinations thereof.

In the present specification, the terms such as "first" and "second" are used herein merely to describe a variety of members, parts, areas, layers, and/or portions, but the constituent elements are not limited by the terms. The members, parts, areas, layers, and/or portions are not limited by the terms. The terms are used only for the purpose of distinguishing one constituent element from another constituent element. Thus, without departing from the scope of the embodiments, a first member, part, area, layer, or portion may refer to a second member, part, area, layer, or portion.

In the drawings, the illustrated shapes may be modified according to, for example, manufacturing technology and/or tolerance. Thus, exemplary embodiments may not be construed to be limited to a particular shape of a part described in the present specification and may include a change in the shape generated during manufacturing, for example.

Figure 1:
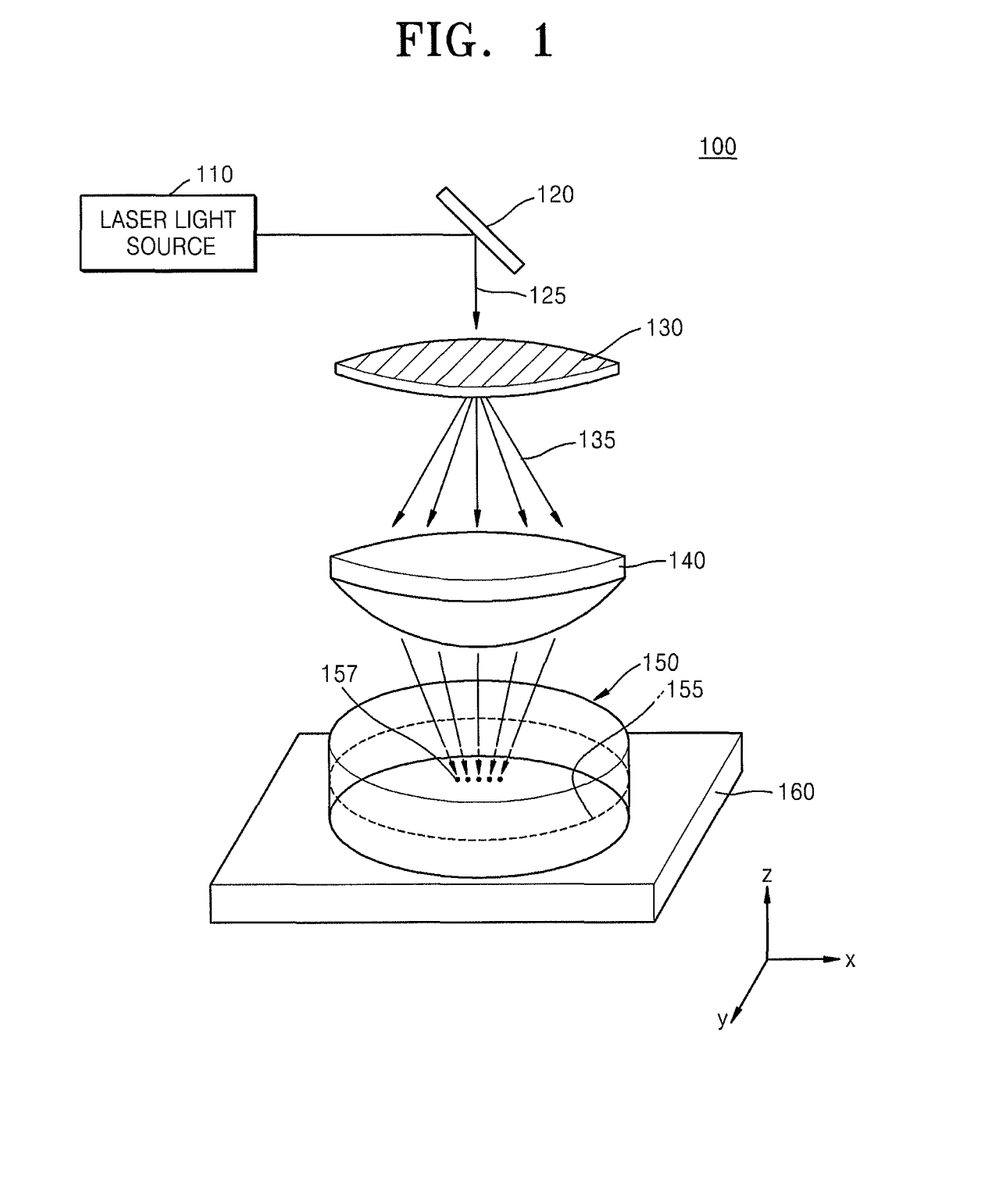
FIG. 1 schematically illustrates a substrate processing apparatus according to an exemplary embodiment.

FIG. 1 schematically illustrates a substrate processing apparatus 100 according to an exemplary embodiment. Referring to FIG. 1, the substrate processing apparatus 100 may include a laser light source 110, a mirror 120, a diffractive optical element (DOE) 130, a focus lens 140, and a moving unit 160. A substrate 150 to be processed may be mounted on the moving unit 160. Examples of the substrate 150 my include a semiconductor substrate, a compound semiconductor substrate, a liquid crystal display (LCD) substrate, a light emitting diode (LED) substrate, other glass/ceramic substrates, and so forth.

The laser light source 110 may be configured to generate a first laser beam 125. The first laser beam 125 may have a wavelength, selected in accordance with a material of the substrate 150 to be processed. For example, the first laser beam 125 may be an infrared (IR) laser beam. The laser light source 100 may be an Nd:YAG laser, an Nd:YV04 laser, an Nd:YLF laser, a titanium sapphire laser, or a fiber laser. In particular, the wavelength may be selected such that, when incident on substrate 150 with sufficient energy, cracks or discontinuities may be formed in the substrate 150. A region having such cracks or discontinuities is referred to herein as a reformed region. The reformed region may include a plurality of reformed areas.

The first laser beam 125 may be directed onto the DOE 130. One or more mirrors 120 may be arranged between the laser light source 110 and the DOE 130 to direct the first laser beam 125 onto the DOE. The DOE 130 may split the first laser beam 125 into a plurality of second laser beams 135. In detail, the DOE 130 may be configured to diffract and transmit an input laser beam into a plurality of laser beams using a diffraction phenomenon.

The DOE 130 may include a plurality of diffraction gratings 132 (see FIG. 2) for forming a one-dimensional or two-dimensional beam array. The DOE 130 may be coupled to a rotation unit (not shown) so that the diffraction gratings 132 may be rotated (see FIG. 2). The rotation unit may rotate the diffraction gratings 132 clockwise or counterclockwise with respect to a direction Z that is perpendicular to a surface of the DOE 130.

The focus lens 140 may be located between the moving unit 160 and the DOE 130. The focus lens 140 may be configured to focus the second laser beams 135 on a plane 155 in the substrate 150, the plane 155 being parallel to a main surface of the substrate 150. Thus, focused light 157 generated in the substrate 150 by the focus lens 140 may be arranged at a constant depth from an upper surface of the substrate 150, e.g., on an interior plane that is parallel to an active device surface of the substrate.

The focused light 157 may be include a plurality of spots corresponding to the second laser beams 135 or may be a continuous beam formed by overlapping the second laser beams 135, depending upon a design and location of the focus lens 140. For example, the focused light 157 may include a plurality of spots having a uniform diameter, for example, 5 μm or less. Also, the focused light 157 may have uniform energy, either within the individual spots or across the continuous beam.

A reformed area 158 (see FIG. 2) may be formed on the plane 155 in the substrate 150 due to the energy of the focused light 157. The reformed area may be wholly within the substrate 150.

The moving unit 160 may have the substrate 150 mounted thereon. The moving unit 160 may be configured to move the substrate 150 in directions X and Y parallel to the main surface of the substrate 150, i.e., to translate the substrate 150 in plane. Alternatively or additionally, the moving unit may be configured to move the substrate 150 around the Z direction, i.e., to rotate the substrate 150 in plane. As the moving unit 160 moves, the location of the focus 157 where laser is focused may be changed so that the reformed area formed on the plane 155 may be extended.

Figure 2:
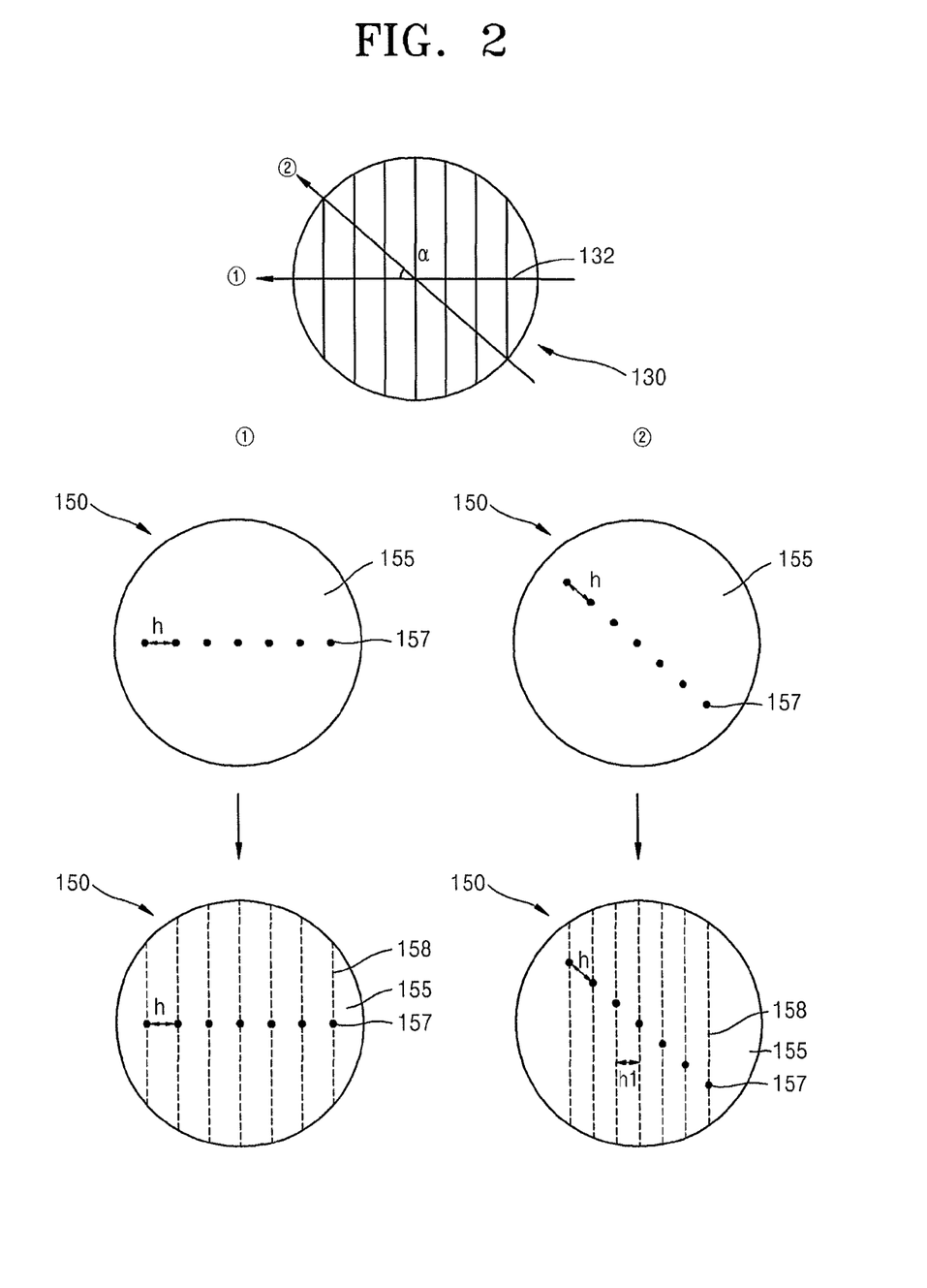
FIG. 2 schematically illustrates a diffractive optical element in the substrate processing apparatus and light focused on a plane of a substrate using the diffractive optical element, according to an exemplary embodiment.

FIG. 2 schematically illustrates the DOE 130 in the substrate processing apparatus 100 and spots of the focused light 157 focused on the plane 155 in the substrate 150 using the DOE 130, according to an exemplary embodiment. As shown herein, the DOE 130 may include a plurality of diffractive gratings 132, e.g., arranged linearly along the direction Y creating focused light 157 having a plurality of spots along the direction X.

Referring to FIG. 2, when the DOE 130 is not rotated relative to the first laser beam 125, the focused light 157 may include a plurality of spots arranged in a first interval "h" along the direction X. In contrast, when the DOE 130 is rotated a predetermined angle "α" relative to the first laser beam 125, the focused light 157 may include a plurality of spots arranged in a second interval "h1" that is shorter than the first interval "h" along the direction X. Thus, by rotating the DOE 130, spacing between the reformed areas 158 formed by the focused light 157 may be adjusted. When the diameter of the spots of the focused light 157 is not greater than 5 μm, the first and second intervals "h" and "h1" separating the reformed areas 158 suitable for surface separation of a substrate may be, for example, 1 μm-10 μm.

Figure 3:
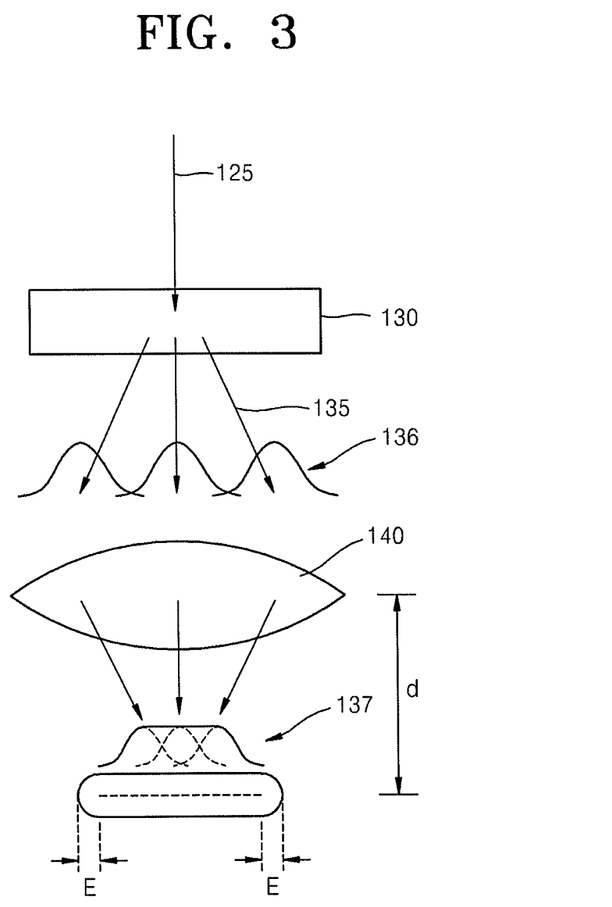
FIG. 3 schematically illustrates the energy distributions of second laser beams and the energy distribution when the focused second laser beams overlap one another.

FIG. 3 schematically illustrates an energy distribution of each of the second laser beams 135 and an energy distribution when the second laser beams 135 overlap one another. Referring to FIG. 3, each of the second laser beams 135 split by the DOE 130 from the first laser beam 125 may have a Gaussian energy distribution 136. When the second laser beams 135 are focused by the focus lens 140, the second laser beams 135 each having the Gaussian energy distribution 136 may overlap one another. A distance "d" between the substrate 150 and the focus lens 140 may be adjusted such that energies of the second laser beams 135 may overlap one another to form the focused light 157 having a uniform energy distribution 137, i.e., an energy distribution that is more uniform than that of the individual second laser beams 135. The uniform energy distribution may coincide with the plane to be separate within the substrate 150.

To adjust the distance "d", the moving unit 160 may be configured to move in a direction Z that is perpendicular to the substrate 150, i.e., translate the substrate 150 out of plane. As a result, by adjusting the distance "d" between the substrate 150 and the focus lens 140, energies at the tails of the Gaussian energy distributions 136, each having low energy relative to a peak of the Gaussian energy distributions 136, overlap one another, allowing a process threshold energy of a material of the substrate 150 to be reached over a more uniform and wider distance. Processing of the substrate 150 using this linear beam having the more uniform energy distribution 137 as the focused light 157 may be performed.

Further, as illustrated in FIG. 3, regions of the substrate 150 on which a process threshold energy is not reached, e.g., above and below the plane and within the plane, but outside the region on which the second laser beams 135 are incident, i.e., edge regions E, are substantially unaffected by the focusing of the second laser beams onto the plane 155 in the substrate 150. In other words, a reformed region, which includes reformed areas, i.e., areas in which cracks or discontinuities are created, is only created where energy exceeding the process threshold energy is incident.

Figure 4:
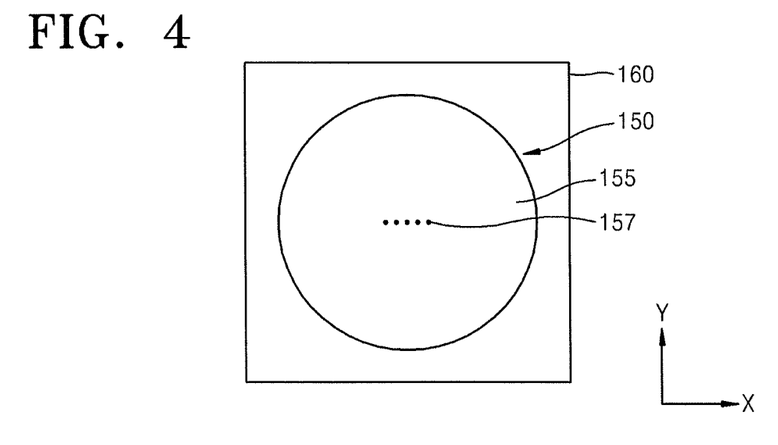
FIGS. 4-8 illustrate an example of a process in which a reformed area is formed on the plane in a substrate.

FIGS. 4-8 illustrate an example of a process in which reformed areas 158 are formed on the plane 155 in the substrate 150 by focused light 157 focused on the plane 155 in the substrate 150 as the moving unit 160 moves. Referring to FIG. 4, the second laser beams 135 focused by the focus lens 140 in the substrate processing apparatus 100 may change the crystal structure of the plane 155 in the substrate 150. In detail, a crystal bonding force of the plane 155 in the substrate 150 may be weakened by laser energy applied by the focused light 157. Although the focused light 157 is illustrated herein as being located at the center of the plane 155 in the substrate 150, embodiments are not limited thereto. For example, the focused light 157 may be located at an end portion of the plane 155 in the substrate 150, or any other position therein.

Figure 5:
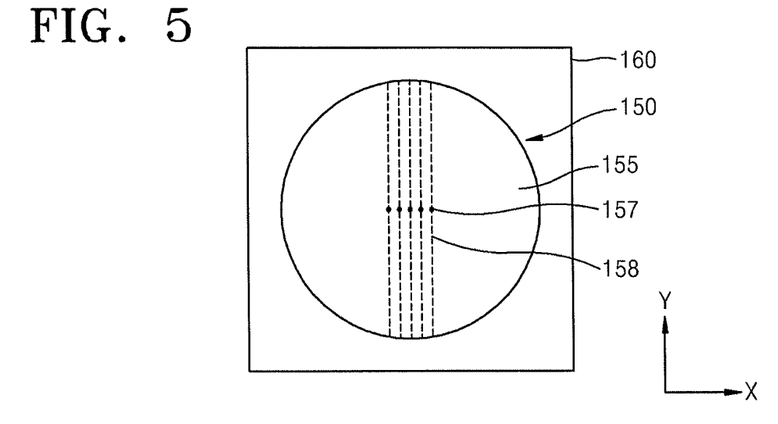

Referring to FIG. 5, the moving unit 160 may move in a first direction, i.e., the direction Y, parallel to the plane 155 in the substrate 150. Thus, the reformed area 158 may be formed on the plane 155 in the substrate 150 along the direction Y. In this case, the second laser beams 135 of FIG. 1 may maintain a state of being focused on the plane 155 in the substrate 150. Thus, the reformed area 158 may be continuously formed in the direction Y.

Figure 6:
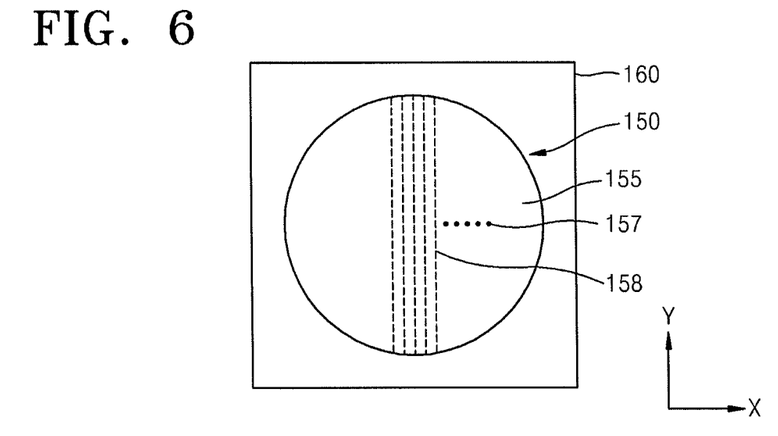

Referring to FIG. 6, the moving unit 160 may move a predetermined distance in a second direction parallel to the plane 155 in the substrate 150 and perpendicular to the direction Y, i.e., the direction X. Accordingly, the substrate 150 mounted on the moving unit 160 may move in the direction X. While the moving unit 160 moves in the direction X, the laser light source 110 of FIG. 1 may not generate the first laser beam 125 of FIG. 1 or the light may otherwise be blocked, such that the focused light 157 may not be incident on the substrate 150. Thus, reformed areas 158 are not formed during translation in the direction X.

Figure 7:
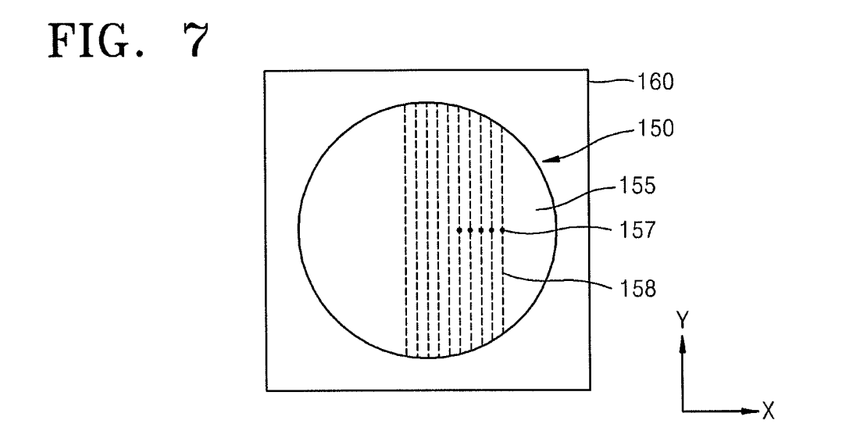

Referring to FIG. 7, as described with reference to FIG. 5, the moving unit 160 may move again in the direction Y. Thus, the substrate 150 mounted on the moving unit 160 is moved in the direction Y so that the reformed area 158 may be formed along the Y direction.

Figure 8:
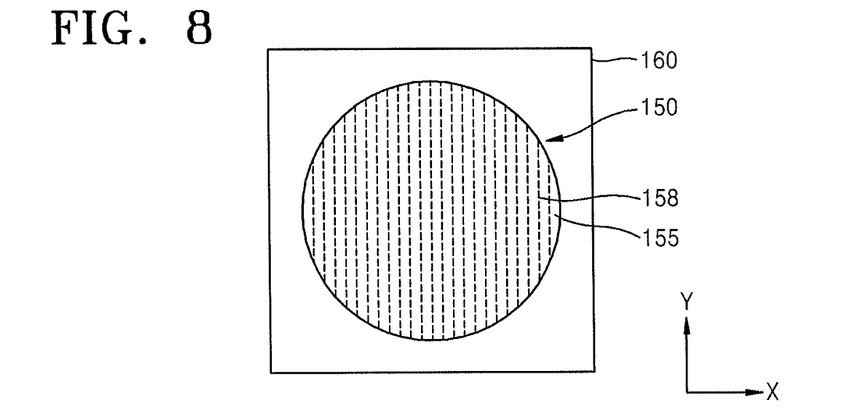

Referring to FIG. 8, it can be seen that the reformed region may include reformed areas 158 formed as lines extending in the Y direction across the entire plane 155 in the substrate 150. The reformed region may be produced through iterations of operations illustrated in FIGS. 6 and 7, i.e., by moving the moving unit 160 in the direction Y and the direction X.

FIGS. 9-13 illustrate another example of a process in which reformed areas 158 are formed on the plane 155 in the substrate 150 by focused light 157 focused on the plane 155 in the substrate 150 as the moving unit 160 moves.

Figure 9:
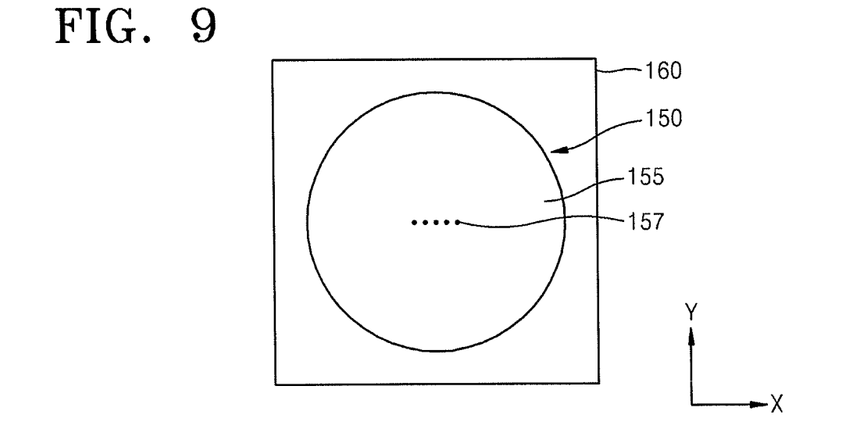
FIGS. 9-13 illustrate another example of a process in which a reformed area is formed on the plane in a substrate.

Referring to FIG. 9, which is the same as FIG. 4, the state in which the second laser beams 135 are focused on the plane 155 in the substrate 150 by the focus lens 140 in the substrate processing apparatus 100 is the same as that described above. Although the focused light 157 is illustrated herein as being located at the center of the plane 155 in the substrate 150, embodiments are not limited thereto. For example, the focused light 157 may be located at an end portion of the plane 155 in the substrate 150, or any other position therein.

Figure 10:
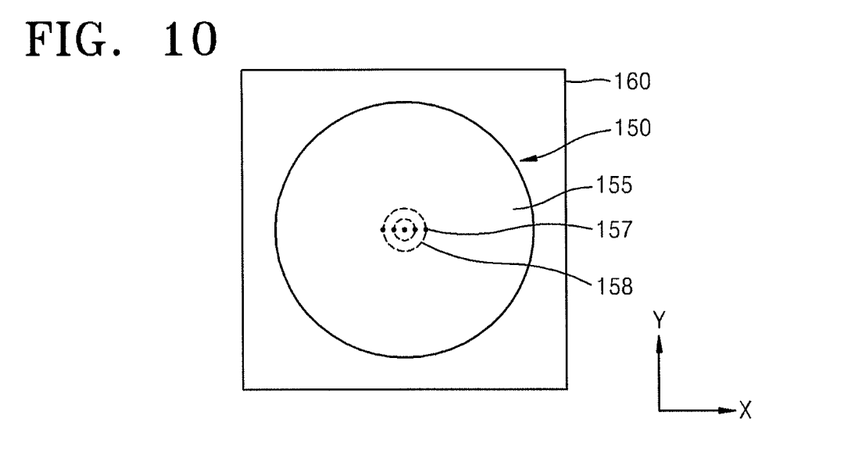

Referring to FIG. 10, the moving unit 160 may rotate clockwise or counterclockwise around an axis in a direction perpendicular to the plane 155 in the substrate 150, i.e., the direction Z. Thus, the substrate 150 mounted on the moving unit 160 rotates clockwise or counterclockwise. Thus, the reformed area 158 may be formed in a circular shape on the plane 155 in the substrate 150.

Figure 11:
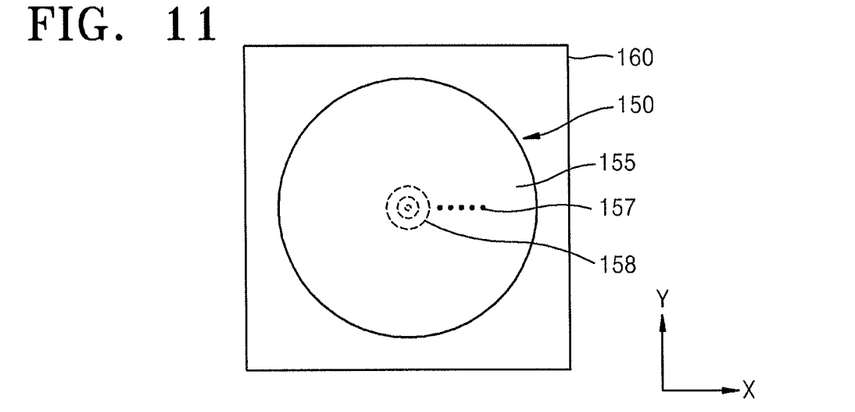

Referring to FIG. 11, the moving unit 160 may move a predetermined distance in a direction parallel to the plane 155 in the substrate 150. The direction may be a direction extending along the direction in which the focused light 157 extends, here the direction X. Accordingly, the substrate 150 mounted on the moving unit 160 may move in the above direction. During translation of the moving unit 160 in the direction X, the laser light source 110 of FIG. 1 may not generate the first laser beam 125 of FIG. 1 or the light may otherwise be blocked, such that the focus light 157 is not incident on the substrate 150. Thus, reformed areas 158 are not formed during this translation.

Figure 12:
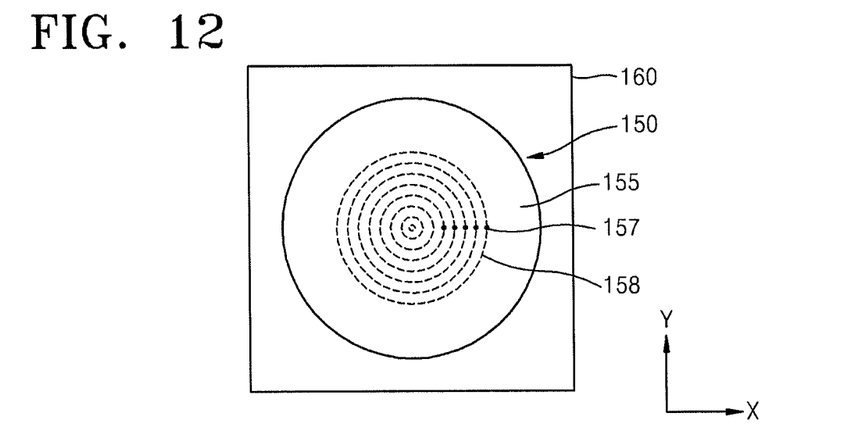

Referring to FIG. 12, the moving unit 160, and thus the substrate 150 mounted thereon, may rotate clockwise or counterclockwise around an axis extending in the direction Z. Thus, reformed areas 158 may be formed in a circular shape on the plane 155 in the substrate 150. The focused light 157 may supply different energy at different radii, so that substantially uniform energy may be applied to the reformed areas 158 having a circular pattern. For example, the energy applied to an outer radius with respect to the center of the plane 155 in the substrate 150 may be larger than that applied to an inner radius.

Figure 13:
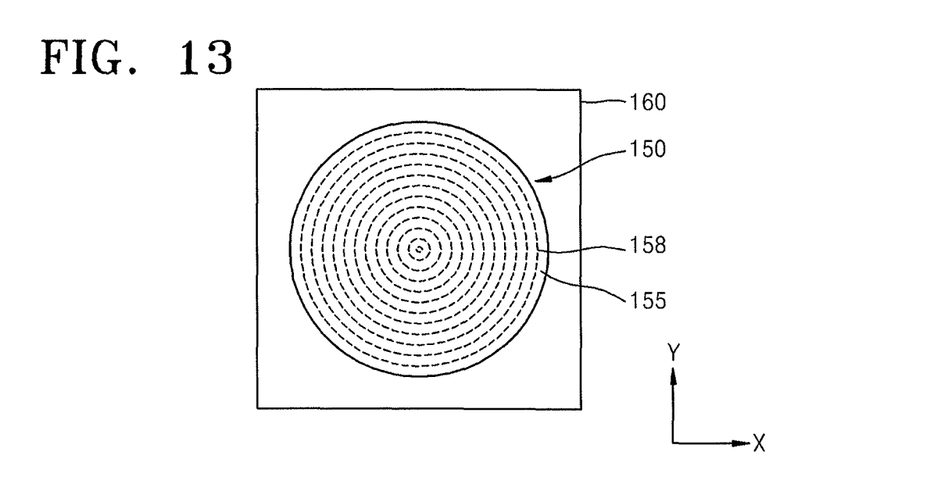

Referring to FIG. 13, it can be seen that the reformed region may include reformed areas 158 concentrically formed on the entire plane 155 in the substrate 150 through the operations of FIGS. 11 and 12. In other words, by moving the moving unit 160 in a direction parallel to the plane 155 in the substrate 150 and rotating the moving unit 160 around an axis in the direction perpendicular to the plane 155 in the substrate 150, the reformed areas 158 may be formed to be concentric.

Figure 14:
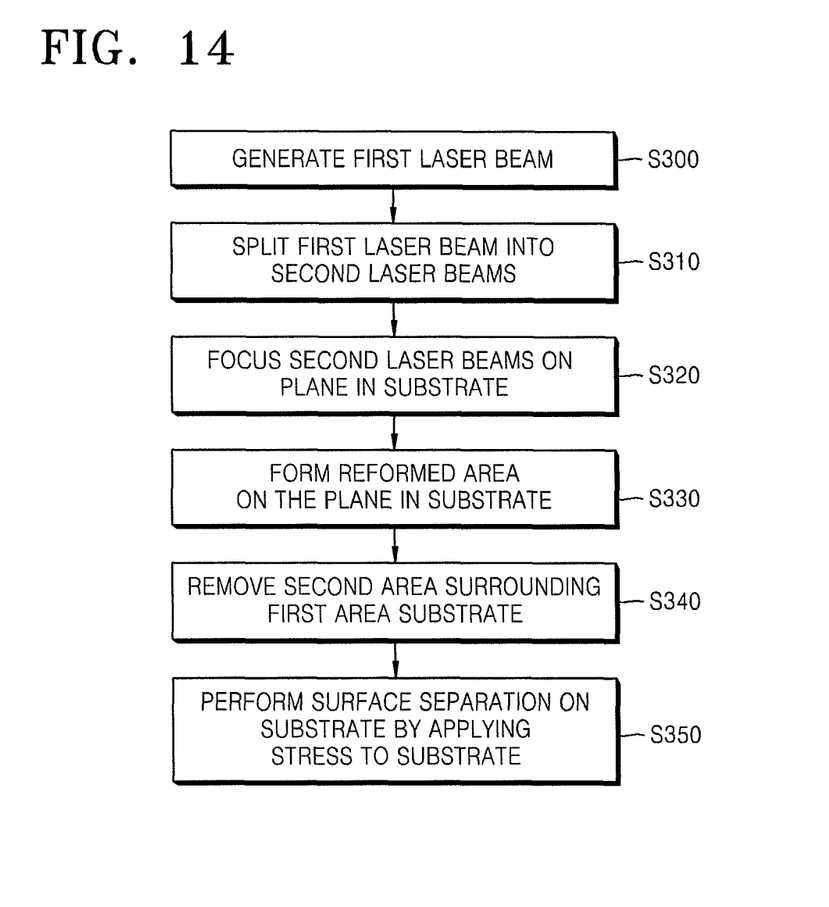
FIG. 14 illustrate a flowchart for explaining a method of processing a substrate according to an exemplary embodiment.

FIG. 14 illustrates a flowchart for explaining a method of processing a substrate according to the exemplary embodiments of the present inventive concept. The substrate processing apparatus 100 of FIG. 1 may be used to perform the method of processing a substrate according to the present exemplary embodiments.

Referring to FIGS. 1 and 14, the laser light source 110 generates the first laser beam 125 (S300). The first laser beam 125 is split into the second laser beams 135 by the DOE 130 (S310). The second laser beams 135 are focused on the plane 155 in the substrate 150 that is parallel to a main surface of the substrate 150 by the focus lens 140 (S320). A reformed area may be formed, e.g., the crystal bonding force of the plane 155 in the substrate 150 may be weakened, by the energies of the second laser beams 135 (S330). Thereafter, the substrate 150 may be moved or rotated to form additional reformed areas 158 formed on the plane 155 in the substrate 150. An additional removing process to remove a second area, e.g., an edge area E (see FIG. 3), where the reformed areas 158 are not formed, from a first area, e.g., the reformed region where the reformed areas 158 are formed, may be performed (S340). Then, the substrate 150 may be surface separated along the plane 155 by applying stress to the substrate 150 so that cracks may be propagated along the plane 155 within the reformed area (S350). As a result, a thinned wafer may be formed.

Figure 15:
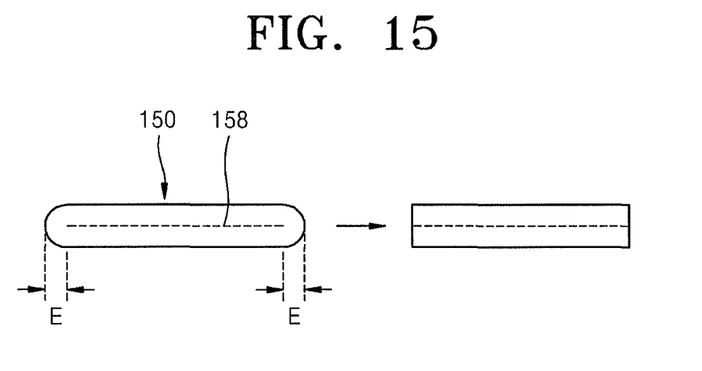
FIG. 15 schematically illustrates an operation of removing an edge area in according to an exemplary embodiment.

FIG. 15 schematically illustrates an operation of removing an edge area in the method of processing a substrate according to the exemplary embodiments. Referring to FIG. 15, the second laser beams 135 may not be focused on the edge area E of the substrate 150 so that the reformed area 158 may not be formed in the edge area E. Thus, for the surface separation of the substrate 150, a trimming process to remove the edge area E may be performed. To perform the trimming process, a laser, grinding, and/or wire-cut may be used.

Figure 16:
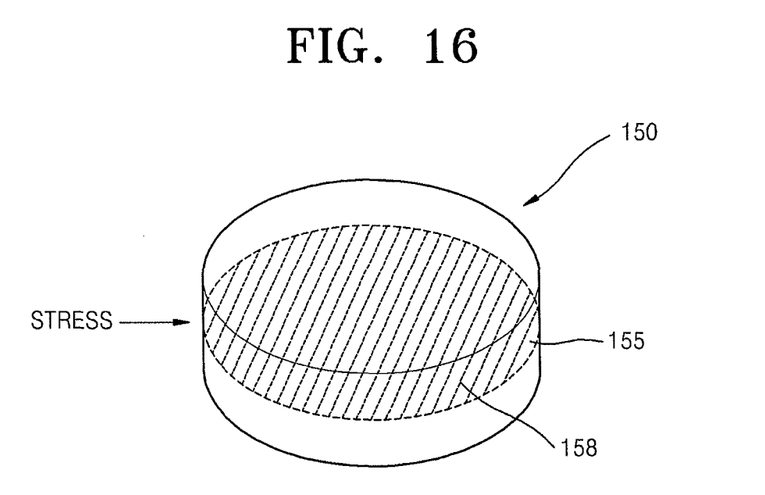
FIGS. 16-18 schematically illustrate examples of applying stress for surface separation of a substrate according to an exemplary embodiment.
Figure 17:
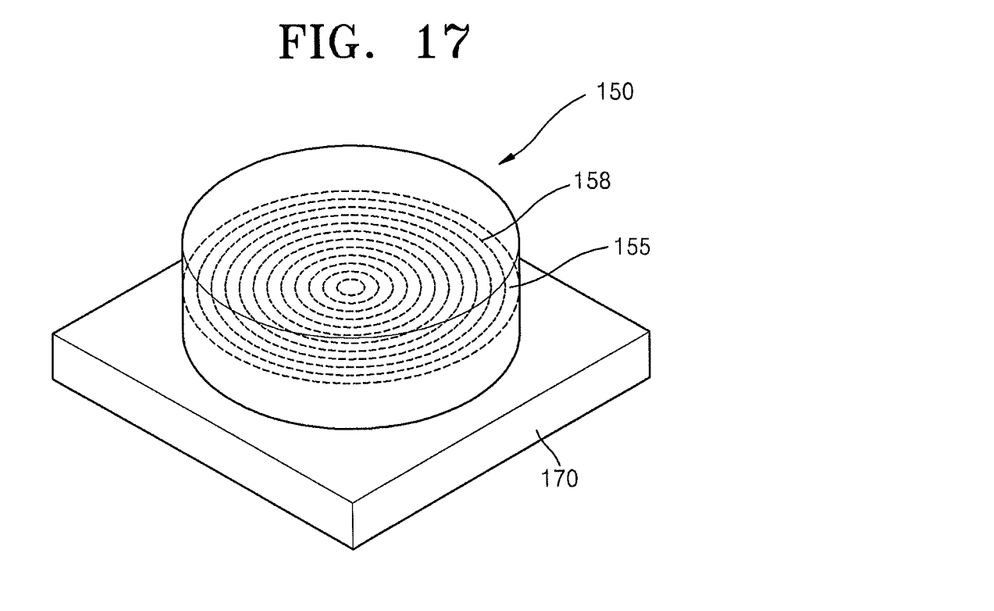
Figure 18:
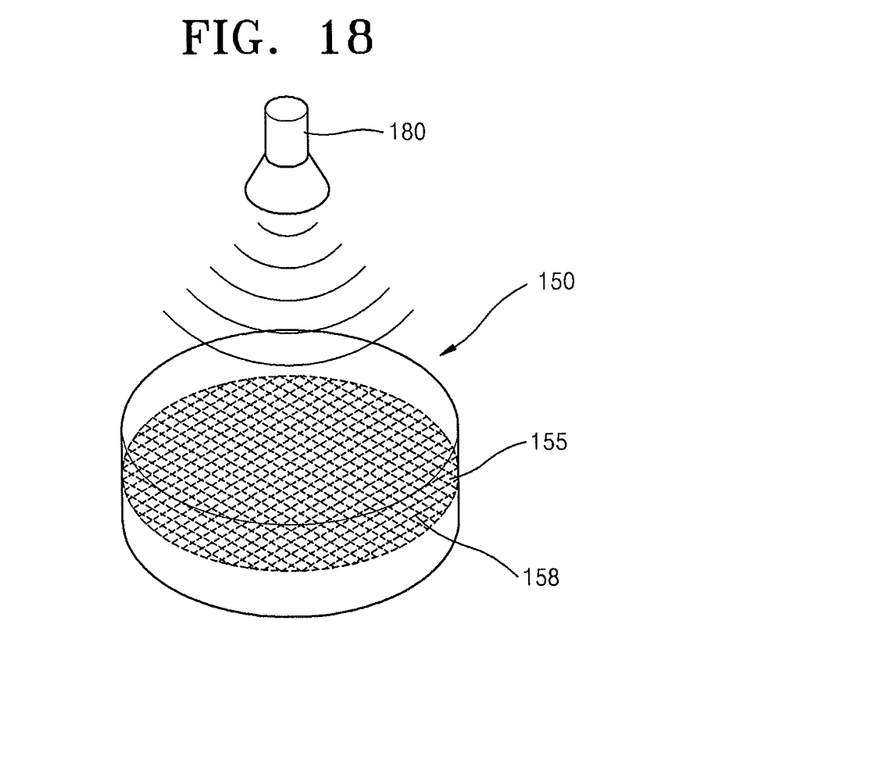

FIGS. 16-18 schematically illustrate examples of applying stress for surface separation of the substrate 150 in the method of processing a substrate according to an exemplary embodiment. Referring to FIG. 16, stress may be applied to a side surface of the substrate 150, i.e., a surface orthogonal to the main surface of the substrate 150. As a result of this stress, cracks may be propagated between the reformed areas 158 of the reformed region along the plane 155. Stress may be applied to the side surface of the substrate 150 using, e.g., water jet, aerosol jet, laser, or a blade.

Referring to FIG. 17, the temperature of the substrate 150 may be changed by using a heating unit 170 so that cracks may be propagated between the reformed areas 158 in the reformed region along the plane 155. In this case, thermal stress is applied to the substrate 150 through thermal expansion or thermal contraction of the substrate 150. Thus, cracks may be propagated between the reformed areas 158 along the plane 155.

Referring to FIG. 18, stress may be applied to the vicinity of the substrate 150 so that cracks may be propagated between the reformed areas 158 of the reformed region along the plane 155. In detail, cracks may be propagated between the reformed areas 158 by applying shock waves generated by an ultraviolet (UV) laser source 180 to the main surface of the substrate 150.

Figure 19:
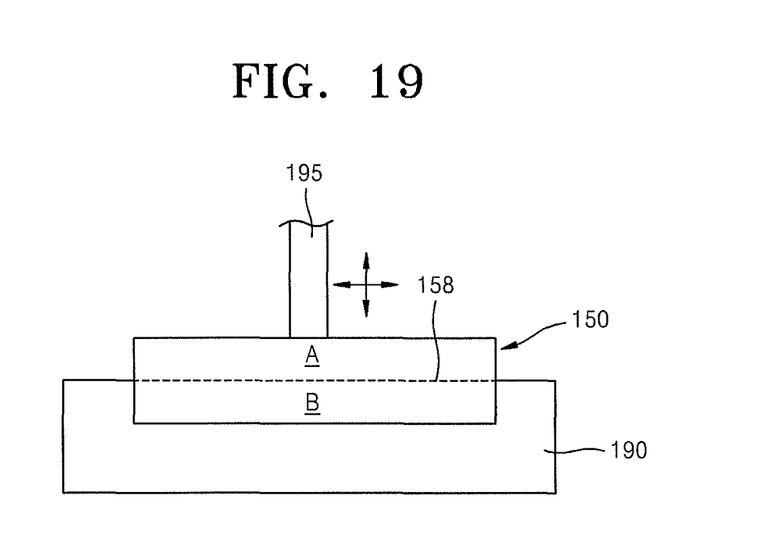
FIGS. 19 and 20 schematically illustrate other examples of applying stress for surface separation of a substrate according to exemplary embodiments.
Figure 20:
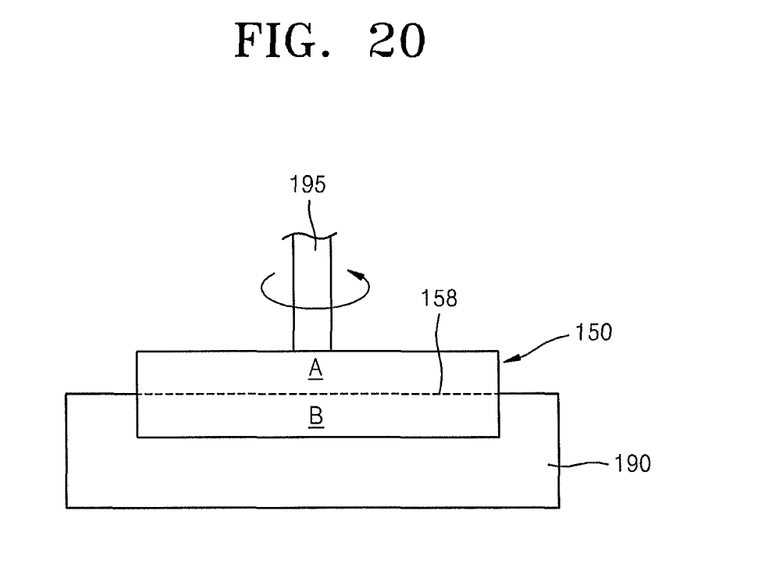

FIGS. 19 and 20 schematically illustrate other examples of applying stress for surface separation of the substrate 150 in the method of processing a substrate according to the exemplary embodiments of the present inventive concept. Referring to FIGS. 19 and 20, an upper area A and a lower area B of the plane 155 in the substrate 150 may be fixed by fixing units 190 and 195. Then, the upper area A and the lower area B of the substrate 150 may be separated from each other by moving the upper area A and the lower area B relative to one another.

For example, as illustrated in FIG. 19, the upper area A may be translated in a direction perpendicular to or parallel to the plane 155. Alternatively or additionally, as illustrated in FIG. 20, the upper area A may be rotated in a direction parallel to the plane 155. Although FIGS. 19 and 20 illustrate that the lower area B is fixed while the upper area A is moved, the upper area A may be fixed while the lower area B is moved or both the upper and lower areas A and B may be moved in opposing directions relative to one another.

As described above, in the method of processing a substrate according to embodiments, a substrate may be thinned by being surface-separated using a laser, such that use of slurry to mechanically polish a surface of the substrate is not necessary to realize a thinned substrate. Thus, process costs may be reduced. Also, residue of the mechanical polishing, e.g., sludge, may be not be generated. That is, embodiments may provide ecologically friendly processing of a substrate.

Also, in the method of processing a substrate according to embodiments, damage or contamination of a wafer that may be generated due to mechanical polishing may be prevented. Thus, yield of a wafer may be improved.

Furthermore, in the method of processing a substrate according to embodiments, a wafer remaining after surface separation may be recycled. Thus, material costs may be reduced.

Exemplary embodiments have been disclosed herein, and although specific terms are employed, they are used and are to be interpreted in a generic and descriptive sense only and not for purpose of limitation. For example, while the above discussion has assumed the substrate is moved relative to components of the processing apparatus, the substrate may be stationary and components moved relative thereto. Further, in some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the present invention as set forth in the following claims.

What is claimed is:

1. A method for processing a substrate, the method comprising:
generating a first laser beam;
splitting the first laser beam into a plurality of second laser beams;

directing the split second laser beams toward a main surface of the substrate and focusing the split second laser beams on a plane in the substrate, the plane being parallel to the main surface along a horizontal direction and being below the main surface along a vertical direction that intersects the horizontal direction; and performing surface separation of the substrate along the plane in the horizontal direction.

2. The method as claimed in claim 1, further comprising translating the substrate, relative to the split second laser beams, in a direction parallel to the plane after focusing the split second laser beams on the plane in the substrate, wherein:

the split second laser beams are firstly focused on a first portion of the plane to firstly modify crystalline structure of the substrate along the plane in regions beyond the first portion, and the split second laser beams are secondly focused on a second portion of the plane to secondly modify crystalline structure of the substrate along the plane in regions beyond the second portion.

3. The method as claimed in claim 1, further comprising rotating the substrate, relative to the split second laser beams, in a direction parallel to the plane after focusing the split second laser beams on the plane in the substrate.

4. The method as claimed in claim 1, wherein splitting the first laser beam includes directing the first laser beam onto a diffractive optical element.

5. The method as claimed in claim 4, wherein the diffractive optical element includes a plurality of diffraction gratings, the method further comprising positioning the plurality of diffraction gratings at an angle relative to the first laser beam.

6. The method as claimed in claim 1, wherein the substrate includes an edge area surrounding the plane, the method further comprising removing the edge area of the substrate before performing the surface separation of the substrate along the plane.

7. The method as claimed in claim 1, wherein:

each of the split second laser beams has a first energy distribution; and focusing the split second laser beams on the plane includes overlapping the split second laser beams to have a second energy distribution along the plane in the substrate, the second energy distribution being more uniform that the first energy distribution.

8. The method as claimed in claim 7, wherein the first energy distribution is a Gaussian energy distribution and focusing the split second laser beams on the plane in the substrate includes directing the split second laser beams onto a focus lens.

9. The method as claimed in claim 1, wherein:

focusing the split second laser beams on the plane in the substrate forms a plurality of reformed areas on the plane in the substrate, the plurality of reformed areas extending from points in the plane on which the split second laser beams are focused; and performing surface separation of the substrate along the plane comprises applying stress to the substrate to allow cracks to be propagated along the plane between reformed areas.

10. The method as claimed in claim 9, wherein applying stress to the substrate includes applying stress to a side surface of the substrate using water jet, aerosol jet, laser, or a blade, the side surface of the substrate being orthogonal to the main surface of the substrate.

11. The method as claimed in claim 9, wherein applying stress to the substrate includes applying shock waves to a side surface of the substrate using an ultraviolet (UV) laser, the side surface of the substrate being orthogonal to the main surface of the substrate.

12. The method as claimed in claim 9, wherein applying stress to the substrate includes applying thermal stress to the substrate by heating or cooling the substrate.

13. The method as claimed in claim 9, wherein applying stress to the substrate comprises:

fixing each of an upper area and a lower area, where the plane is disposed therebetween, the upper area including the main surface of the substrate and the lower area including a lower surface of the substrate that opposes the main surface; and moving at least one of the upper area and the lower area in a direction orthogonal to or parallel to the plane.

14. The method as claimed in claim 1, further comprising:

forming a plurality of reformed areas by moving the substrate, the plurality of reformed areas extending from regions of the plane on which the split second laser beams are focused, the reformed areas being within the substrate; and performing the surface separation of the substrate along the plane includes separating the substrate at the reformed areas.

15. The method as claimed in claim 14, further comprising, before performing surface separation, removing an edge area in a direction orthogonal to the plane, the edge area surrounding reformed areas on the plane in the substrate.

16. The method as claimed in claim 1, wherein a portion of the substrate between the plane and the main surface is not damaged during the directing the split second laser beams.

17. A method for processing a substrate, the method comprising:

forming a reformed region along a plane in the substrate, the plane being parallel to a main surface of the substrate along a horizontal direction and being below the main surface along a vertical direction that intersects the horizontal direction, and the reformed region being elongated along the horizontal direction, and separating the substrate along the plane of the substrate in the horizontal direction.

18. The method as claimed in claim 17, wherein:

forming the reformed region includes focusing light on the plane, and focusing the light includes providing a focus lens facing the main surface of the substrate, the light is firstly focused on a first portion of the plane to form a first reformed region extending from the first portion, the first reformed region of the substrate having a first modified crystalline structure, the light is secondly focused on a second portion of the plane to form a second reformed region extending from the second portion, the second reformed region of the substrate having a second modified crystalline structure, and separating the substrate along the plane includes horizontally separating the substrate along at least the first and second reformed regions.

19. The method as claimed in claim 18, wherein focusing light includes providing light on the plane having a more uniform energy distribution than a Gaussian distribution.

20. The method as claimed in claim 17, wherein separating the substrate includes applying stress to a side surface of the substrate, the side surface of the substrate being orthogonal to the main surface of the substrate.

21. The method as claimed in claim 17, wherein a separating the substrate includes:
   fixing each of an upper area and a lower area, where the plane is disposed therebetween, the upper area including the main surface of the substrate and the lower area including a lower surface of the substrate that opposes the main surface; and
   moving at least one of the upper area and the lower area in a direction orthogonal to or parallel to the plane.

22. The method as claimed in claim 17, wherein a portion of the substrate between the plane and the main surface is not damaged during the forming the reformed region.

* * * * *